(12) United States Patent
Honda

(10) Patent No.: US 7,808,224 B2
(45) Date of Patent: Oct. 5, 2010

(54) HIGH-FREQUENCY POWER SUPPLY CIRCUIT

(75) Inventor: Tadashi Honda, Kawasaki (JP)

(73) Assignee: Advanced Design Corp. (JP)

( * ) Notice: Subject to any disclaimer, the term of this patent is extended or adjusted under 35 U.S.C. 154(b) by 247 days.

(21) Appl. No.: 12/097,861

(22) PCT Filed: Aug. 11, 2006

(86) PCT No.: PCT/JP2006/322257

§ 371 (c)(1),
(2), (4) Date: Jun. 17, 2008

(87) PCT Pub. No.: WO2007/080697

PCT Pub. Date: Jul. 19, 2007

(65) Prior Publication Data

US 2009/0201004 A1    Aug. 13, 2009

(30) Foreign Application Priority Data

Jan. 16, 2006    (JP) .............................. 2006-007745

(51) Int. Cl.
G05F 3/00    (2006.01)
(52) U.S. Cl. .................. 323/304; 323/242; 323/288
(58) Field of Classification Search .................. 323/241, 323/242, 282, 283, 288, 304
See application file for complete search history.

(56) References Cited

U.S. PATENT DOCUMENTS 6,348,238 B1    2/2002   Mizuno et al. .............. 427/524
2004/0160218 A1*  8/2004   Chou et al. .................. 323/303
2005/0212501 A1*  9/2005   Acatrinei .................... 323/283
2006/0091874 A1*  5/2006   Takeuchi .................... 323/314

FOREIGN PATENT DOCUMENTS

| JP | 62-178171   | 8/1987  |
|----|-------------|---------|
| JP | 6-303769    | 10/1994 |
| JP | 6-338476    | 12/1994 |
| JP | 7-15958     | 1/1995  |
| JP | 8-167500    | 6/1996  |
| JP | 8-255782    | 10/1996 |
| JP | 2000-256845 | 9/2000  |
| JP | 2003-347092 | 12/2003 |

* cited by examiner

Primary Examiner—Bao Q Vu
Assistant Examiner—Nguyen Tran
(74) Attorney, Agent, or Firm—Hayes Soloway P.C.

(57) ABSTRACT

To accurately regulate output of a high-frequency power with a simple configuration. A high-frequency power supply circuit includes: a basic drive square wave generation circuit unit (5) for generating a basic drive square wave having an output frequency; a differential signal generation circuit unit (9) for generating a front edge differential signal of the basic drive square wave; a vibrator circuit unit (15) having a square wave signal generator (10) for outputting a square wave signal having a signal width within a period corresponding to a half cycle of the output frequency upon input of a trigger signal from outside and signal width control circuits (11, 12) varying/controlling the signal width of the square wave signal according to the control signal; and a switching amplification circuit unit (6) for amplifying the amplification source signal based on the output signal from the vibrator circuit unit (15). The front edge differential signal generated by the differential signal generation circuit unit (9) is made to be a trigger signal in the vibrator circuit unit (15).

8 Claims, 9 Drawing Sheets

FIG. 2 (a) BASIC DRIVE SQUARE WAVE 13.56MHz
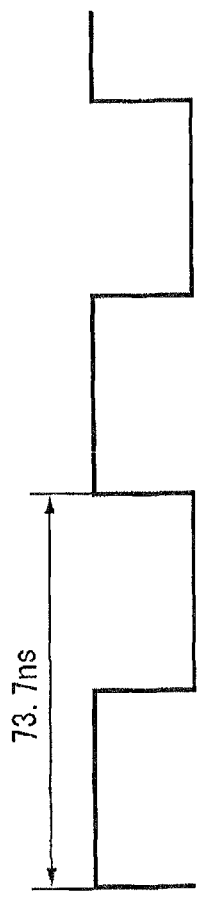
FIG. 2 (b) DIFFERENTIAL SIGNAL
FIG. 2 (c) REVERSING UNIT 1 OUTPUT SIGNAL
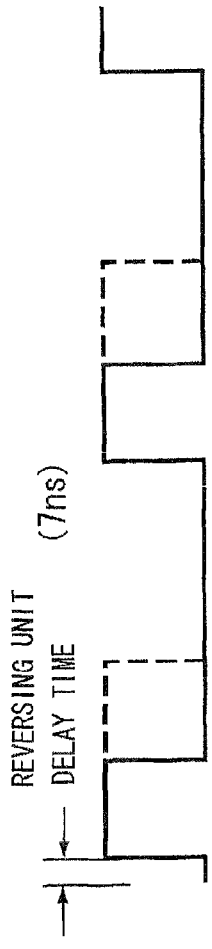
FIG. 2 (d) DELAY CIRCUIT UNIT OUTPUT SIGNAL
FIG. 2 (e) AMPLIFICATION SOURCE SIGNAL

REVERSING UNIT OPERATION CONDITIONS OF IC2

|         | INITIALLY | DURING DIFFERENTIAL SIGNAL INPUT | IMMEDIATELY AFTER DIFFERENTIAL SIGNAL INPUT | AFTER DIFFERENTIAL SIGNAL INPUT HAS ENDED | TIME CONSTANT TIME ELAPSED |
|---------|-----------|----------------------------------|---------------------------------------------|-------------------------------------------|----------------------------|
| INPUT 1 | 1         | 1                                | 0                                           | 0                                         | 1                          |
| INPUT 2 | 1         | 0                                | 0                                           | 1                                         | 1                          |
| OUTPUT  | 0         | 1                                | 1                                           | 1                                         | 0                          |

U S 7,808,224 B2

HIGH-FREQUENCY POWER SUPPLY CIRCUIT

TECHNICAL FIELD

The present invention relates to a high-frequency power supply circuit used in a high-frequency power supply apparatus or the like for supplying high-frequency power to a plasma generator or the like.

BACKGROUND ART

In conventional practice, high-frequency power supply circuits used in high-frequency power supply apparatuses or the like for supplying high-frequency power to plasma generators or the like use linear amplifiers connected in multiple stages so that minute vibrations in internal liquid crystal oscillators are amplified to the final output. Such amplifiers use an amplification scheme known as linear amplification, which is an amplification scheme having a comparatively low efficiency of about 50%.

However, as semiconductor wafers and display panels or the like having transistors incorporated therein have both increased in size, plasma treatment apparatuses have also increased in size, and greater outputs have been required for the power sources for the plasma. In conventional low-efficiency amplifiers, the volume and lost power increase dramatically with increased output, and commercial demand has therefore not been satisfied. High-frequency power sources that use an amplification scheme known as switching-mode amplification and provided with higher efficiency (80% or more) than in the prior art have recently been put into use.

DISCLOSURE OF THE INVENTION

Problems to be Solved by the Invention

However, since switching-mode amplification involves the application of PWM techniques, it is believed that the output power of the high-frequency power source is controlled by controlling the pulse width (duty). In conventional practice, however, methods implemented using thyristor-based firing control are used to control the pulse width (duty) as shown in FIG. 5, for example, but the pulse width that can be controlled in such thyristor-based firing control must have a frequency of about several hundred kilohertz. If the frequency supplied from the high-frequency power source is comparatively high, such as in the megahertz range, which is greater than several hundred kilohertz and which may, for example, be 13.56 MHz, the pulse is narrow as such, and it is difficult to control the output power of the high-frequency power source by controlling the pulse width. Therefore, the high-frequency output power of a high-frequency power source is controlled by keeping the amplified pulse width constant and controlling (increasing and reducing) the drive voltage used in this amplification to control the output power. In this case, the time difference until the output power changes due to a change in the drive voltage is extremely large at 120 milliseconds, as shown in FIG. 9, and the efficiency is further reduced. Even with switching-mode amplification at a comparatively low frequency, a minimum of one cycle of about several milliseconds is required, which is a common oscillation cycle. Problems are therefore encountered in cases in which output power cannot be controlled with high precision over time, and, at worst, the manufactured products themselves are damaged and become defective.

The present invention was devised in view of such problems, and an object thereof is to provide a high-frequency power supply circuit in which a simple configuration can be used to regulate and control output power with high precision over time in switching-mode amplification for outputting such high frequencies.

Means for Solving these Problems

In order to solve the problems described above, the high-frequency power supply circuit according to a first aspect of the present invention is characterized in comprising:

a basic drive square wave generation circuit unit for generating a basic drive square wave having an output frequency outputted from a high-frequency power supply circuit; a differentiation signal generation circuit unit for generating a front edge or rear edge differential signal of the generated basic drive square wave; a vibrator circuit unit having a square wave signal generator for outputting a square wave signal having a signal width within a time period corresponding to a half cycle of the output frequency upon input of a trigger signal from an external source, and signal width control circuits for variably controlling the signal width of the square wave signal on the basis of a control signal for controlling power output based on the output frequency; and a switching amplification circuit unit for amplifying an amplification source signal based on an output signal from the vibrator circuit unit; the differential signal being generated by the differential signal generation circuit unit is used as a trigger signal in the vibrator circuit unit.

According to this aspect, in the vibrator circuit unit, the input of the differential signal is used as a trigger for the amplification source signal, a square wave signal is generated having a signal width shorter than a half cycle of the output frequency having an output time period based on the control signal, and the amplification source signal is amplified in the switching amplification circuit unit. Therefore, even if the output frequency is high, the signal width of the amplification source signal can be varied according to the control signal with a simple configuration, and, consequently, the regulation of the output power from the high-frequency power supply circuit amplified by the switching amplification circuit unit can be controlled precisely over time with a simple configuration.

The high-frequency power supply circuit according to a second aspect of the present invention is the high-frequency power supply circuit according to the first aspect, characterized in that:

the square wave signal generator comprises a first reversing unit for initiating reverse output of an input signal upon the input of the differential signal; and the signal width control circuit has a second reversing unit for reversing the output signal from the first reversing unit and inputting the reversed signal to the first reversing unit, and a time constant circuit unit whereby the output signal outputted from the second reversing unit is blocked from being inputted to the first reversing unit within a time period determined by a time constant that varies according to the control signal.

According to this aspect, the signal width control circuit can be configured in a simple configuration by using the monostable vibrator based on a DC-AC link as the vibrator circuit unit. Therefore, there is a greater degree of freedom in the circuit design, and a vibrator circuit unit having satisfactory precision with a simple configuration can be obtained.

The high-frequency power supply circuit according to a third aspect of the present invention is the high-frequency power supply circuit according to the second aspect, characterized in that:

the first reversing unit is formed from a multi-input transformation logic gate circuit.

According to this aspect, the first reversing unit 10 is formed using, e.g., a NAND gate or another such multi-input transformation logic gate circuit that can operate at higher speeds than a common MSI multivibrator, whereby a square wave signal of a shorter signal width can be generated, and the range of controllable output power can be further increased.

The high-frequency power supply circuit according to a fourth aspect of the present invention is the high-frequency power supply circuit according to any of the first through third aspects, characterized in that:

the square wave signal generator outputs a square wave signal having a signal width of at least half or less of one cycle time during the signal propagation delay times of at least two logic gates or fewer in one cycle time of the output frequency.

According to this aspect, since the signal width can be varied with each cycle of output frequency, the output power within the same cycle can be controlled with maximum precision over time.

The high-frequency power supply circuit according to a fifth aspect is the high-frequency power supply circuit according to any of the first through fourth aspects, characterized in comprising:

a logic gate circuit for receiving input of the basic drive square wave and an output signal from the vibrator circuit unit, and extracting the inputted basic drive square wave according to the inputted output signal from the vibrator circuit unit; wherein the switching amplification circuit unit amplifies the output signal from the logic gate circuit as the amplification source signal.

According to this aspect, the signal width of an amplification source signal can be prevented from reversing, and disturbance can be prevented from being caused by the reversing of the signal width (reversed duty).

The high-frequency power supply circuit according to a sixth aspect of the present invention is the high-frequency power supply circuit according to the fifth aspect; characterized in comprising:

a delay circuit for delaying the basic drive square wave inputted to the logic gate circuit within the signal propagation delay time period in the vibrator circuit unit.

According to this aspect, it is possible to avoid drawbacks in which the signal width of the amplification source signal extracted by the logic gate circuit becomes shorter in proportion to the signal propagation delay time.

The high-frequency power supply circuit according to a seventh aspect is the high-frequency power supply circuit according to any of the first through sixth aspects, characterized in that:

the time constant circuit unit has, as a time constant control element, a field-effect transistor (FET), a Cds element, a variable-capacitance diode, or a combination thereof.

According to this aspect, the time constant does not readily fluctuate in large amounts over time, and stable and continuous control can therefore be achieved using the control signal inputted to the time constant circuit unit.

The high-frequency power supply circuit according to an eighth aspect is the high-frequency power supply circuit according to any of the first through seventh aspects, characterized in that:

the basic drive square wave generation circuit has a double-frequency generation circuit for generating a double frequency of the basic drive square wave; and the double frequency generated by the double-frequency generation circuit is used to generate a basic drive square wave having a duty ratio of approximately 50%.

According to this aspect, a basic drive square wave having a duty ratio of about 50% can be generated with a high degree of precision.

BRIEF DESCRIPTION OF THE DRAWINGS

FIGS. 2(a) through (e) are flowcharts showing the timing of various signals in the high-frequency power supply circuit in the embodiment in FIG. 1;

KEY

Figure 1:
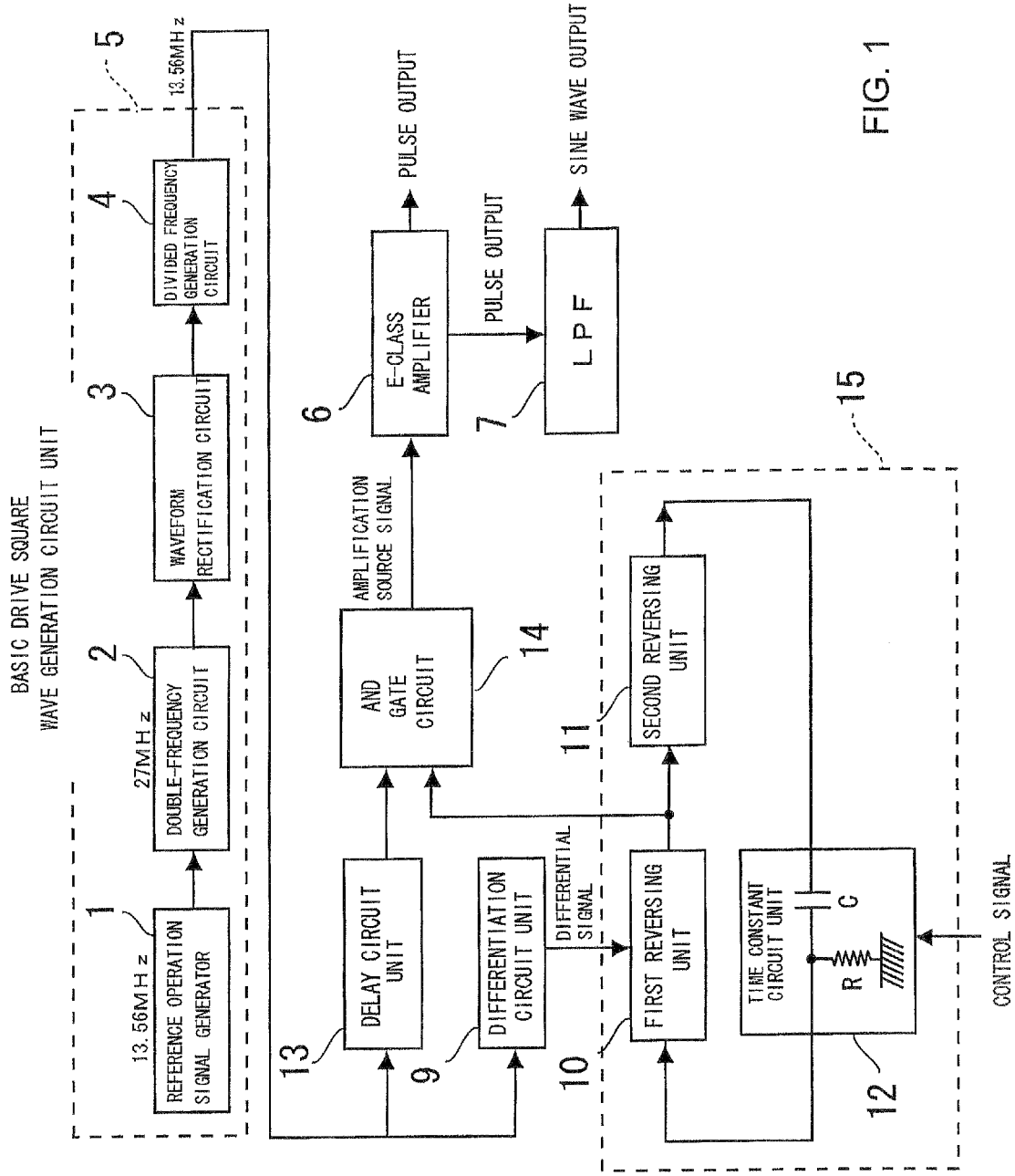
FIG. 1 is a circuit structure diagram showing an embodiment of the high-frequency power supply circuit of the present invention.

1 Basic operation signal generator
2 Double-frequency generation circuit
3 Waveform rectification circuit
4 Divided frequency generation circuit
5 Basic drive square wave generation circuit unit
9 (Rear edge) differentiation circuit unit
10 First reversing unit
11 Reversing unit
12 Time constant circuit unit
12 E-class amplifier
12 Time constant circuit unit
13 Delay circuit unit
14 AND gate circuit
15 Monostable multivibrator
Q1 Field-effect transistor (FET)
IC$_2$ NAND gate circuit

BEST MODE FOR CARRYING OUT THE INVENTION

Embodiments of the present invention are described hereinbelow.

To describe the embodiments of the present invention with reference to the drawings, first, FIG. 1 is a circuit structure diagram showing the configuration of the high-frequency power supply circuit of the present embodiment.

The high-frequency power supply circuit of the present embodiment is configured from a basic drive square wave generation circuit unit 5 for generating a basic drive square wave, which is a square wave having a duty ratio of about 50% and having the same frequency as the output frequency outputted from the high-frequency power supply circuit; a differentiation circuit unit 9 for generating a front-edge differential signal of the basic drive square wave generated by the basic drive square wave generation circuit unit 5; a monostable multivibrator 15 composed of a first reversing unit 10 to which the front-edge differential signal generated by the differentiation circuit unit 9 is inputted, a second reversing unit 11 for reversing and outputting the output signal from the first reversing unit 10, and a time constant circuit unit 12 for variably controlling the time in which the output signal from the second reversing unit 11 is inputted to the first reversing unit 10; a delay circuit unit 13 whereby the basic drive square wave generated by the basic drive square wave generation circuit unit 5 is delayed by the signal propagation delay time in the first reversing unit 10; an AND gate circuit 14, which is a logic gate circuit in the present invention and to which the basic drive square wave delayed by the delay circuit unit 13 and the output signal from the first reversing unit 10 are inputted; and an E-class amplifier 6, which is a switching amplification circuit unit in the present invention for amplifying the amplification source signal outputted from the AND gate circuit 14, as shown in FIG. 1.

The basic drive square wave generation circuit unit 5 of the present embodiment is also configured from a basic operation signal oscillator 1, a double-frequency generation circuit 2, a waveform rectification circuit 3, and a divided frequency generation circuit 4, as shown in FIG. 1.

This basic operation signal generator 1 can be an oscillator that outputs a high-frequency signal of 13.56 MHz if the output frequency is 13.56 MHz, the output frequency being specifically the frequency of the high-frequency output of a high-frequency power supply circuit, e.g., the previously described frequency of the high-frequency output, which is a frequency equal to or greater than the megahertz range and which cannot be controlled by a thyristor. The basic drive signal, which is a high-frequency signal generated by the basic operation signal generator 1, is doubled to a frequency of 27.12 MHz by a conventional double frequency circuit.

The basic drive signal having a doubled frequency of 27.12 MHz is appropriately amplified in amplitude by an amplifying transistor (not shown), fed to the waveform rectification circuit 3, and shaped to a square wave of 27.12 MHz. A square wave generation circuit normally used in digital circuits or the like, i.e., a circuit that uses a reversing unit in multiple stages (for example, two stages), can be satisfactorily used as the waveform rectification circuit 3.

The basic drive signal shaped in the waveform rectification circuit 3 into a square wave having a doubled frequency of 27.12 MHz is supplied to the divided frequency generation circuit 4 composed of, e.g., a pulse counter or the like; and square waves divided by two into frequencies of 13.56 MHz, or square wave divided by eight into frequencies of 3.39 MHz are generated according to the output frequency. In the example described hereinafter, the halved frequencies of 13.56 MHz are used in order to bring the output frequency to 13.56 MHz.

Square waves generated by the basic drive square wave generation circuit unit 5 are thus generated based on the doubled frequency square waves, producing basic drive square waves (13.56 MHz) as square waves having a duty ratio of about 50%, as shown in FIG. 2. Some of these waves are supplied to the AND gate circuit 14 via the delay circuit unit 13, and others are supplied to the differentiation circuit unit 9, are changed to front-edge differential signals, and are thereby used as trigger signals for the monostable multivibrator 15.

In the monostable multivibrator 15 used in the present embodiment, a control signal for controlling the output power is inputted to the time constant circuit unit 12, and the time constant is varied according to this control signal, whereby a signal of a short pulse width is outputted to the AND gate circuit 14 by a reduction in the time constant in cases in which a control signal for reducing the output power is inputted, and a signal of a long pulse width is outputted to the AND gate circuit 14 by an increase in the time constant in cases in which a control signal for increasing the output power is inputted.

Figure 3:
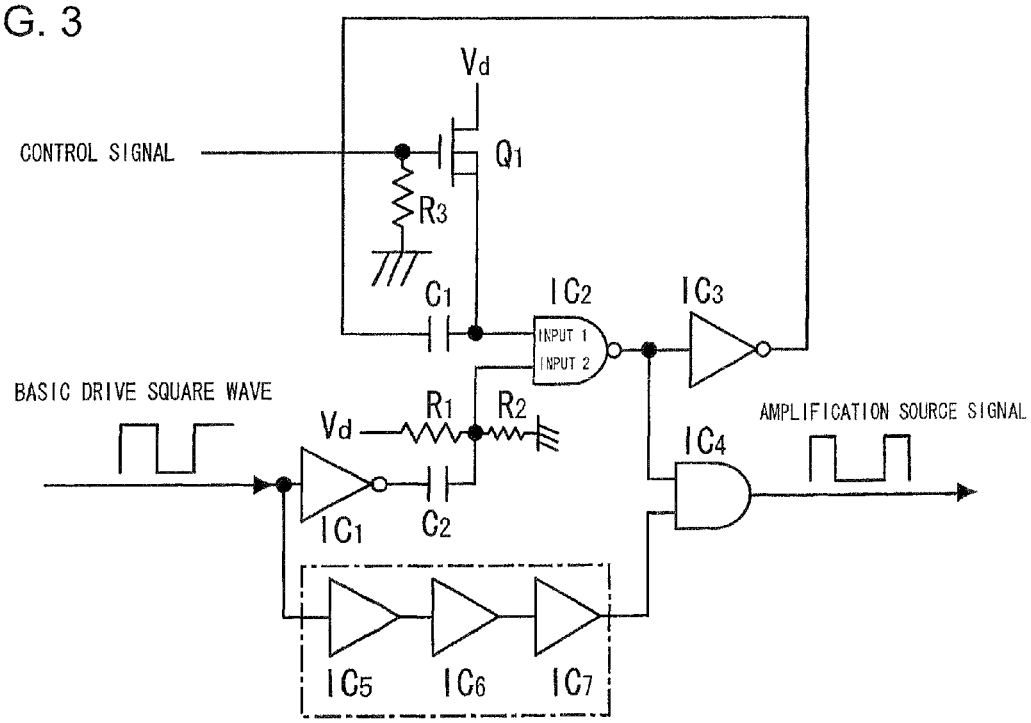
FIG. 3 is a diagram showing the configuration of the high-frequency power supply circuit in an example of the present invention.

In the monostable multivibrator 15, as shown in FIG. 1, two reversing units are linked by an AC-DC link, and the first reversing unit 10 used herein must be able to operate at: a high speed and be capable of outputting a square wave having a pulse width (signal width) shorter than about 36.8 nanoseconds, which is half of one cycle of 73.7 nanoseconds, as shown in FIG. 2, provided the half cycle of the high-frequency output frequency, that is, the output frequency, is 13.56 MHz, as shown in FIG. 1. A reversing unit in which a NAND gate circuit $IC_2$ is used as the actual circuit in the example described hereinafter as shown in FIG. 3 may be used as the first reversing unit 10.

Thus, using a NAND gate circuit $IC_2$ makes it possible to output square waves having pulse widths that are shorter and more precise, because the logic gate circuits allow for faster operation than common MSI multivibrators. With the pulse widths (signal width) formed in the NAND gate circuit $IC_2$ and outputted from the first reversing unit 10, the basic drive square wave is extracted in the AND gate circuit 14 ($IC_4$ in FIG. 3) to create an amplitude source signal. Therefore, the shorter these pulse widths, the smaller the size of the minimum pulse width of the amplitude source signal; i.e., the size of the output power controlled by the pulse widths. Consequently, the range of controllable output power can be made larger, the minimum units that can be controlled within a variable range are smaller, and more precise output control can be achieved.

In the example in FIG. 3 described hereinafter, a NAND gate circuit $IC_2$ is used as the first reversing unit 10, but the present invention is not limited to this option alone, and reversing units capable of high-speed operation based on other configurations may also be used.

Since the second reversing unit 11 merely reverses the output of the first reversing unit 10, the second reversing unit 11 can be a unit that has relatively few propagation delays and can operate at the output frequency level.

The time constant circuit unit 12 constituting the monostable multivibrator 15 may be a time constant circuit normally used as a time constant circuit unit and configured from a capacitor (C) and variable resistance (R). With a time constant circuit using a capacitor (C) and variable resistance (R), however, the time constant is apt to vary greatly over time, and it is difficult to achieve stable continuous control. Therefore, in the example shown in FIG. 3, a field-effect transistor (FET) $Q_1$ in which the time constant does not vary greatly over time, and in which power signals can be used as control signals, is used as the time constant control element. The grounding of the R in FIG. 1 is high-frequency grounding.

Operation of the high-frequency power supply circuit of the present example shown in FIG. 1 is described below by using the signal forms (timing) of the sections shown in FIG. 2. A basic drive square wave (13.56 MHz) having a duty ratio of about 50% is generated in the basic drive square wave generation circuit unit 5, as shown in FIG. 2(*a*).

The generated basic drive square wave is inputted to the differentiation circuit unit 9, and is thereby converted to a front-edge differential signal whose front edge alone is extracted, as shown in FIG. 2(*b*). The front-edge differential signal is inputted as a trigger signal to the first reversing unit 10.

The first reversing unit 10 begins signal output upon the input of the front-edge differential signal from the differentiation circuit unit 9, and signal output is ended at the moment in time when the reversed output of this signal output by the second reversing unit 11 is inputted to the first reversing unit 10 due to the passage of time based on the time constant set by the time constant circuit unit 12. In other words, at the moment in time when the front-edge differential signal is inputted, the first reversing unit 10 outputs a signal of a pulse width (signal width) corresponding to a time period based on the time constant set by the time constant circuit unit 12, as shown in FIG. 2(c).

Since a temporal delay, i.e., a signal propagation delay time, occurs from the time the front-edge differential signal is inputted until the time the signal is actually outputted as shown in FIG. 2(c), an output signal delayed by the signal propagation delay time is inputted to the AND gate circuit 14. When a basic drive square wave is inputted directly, the signal width of the basic drive square wave extracted in the AND gate circuit 14 is shorter by the signal propagation delay time. Therefore, in order to avoid this problem, the basic drive square wave is sent through the delay circuit unit 13 for delaying the basic drive square wave by the signal propagation delay time in the first reversing unit 10, whereby both signals inputted to the AND gate circuit 14 are synchronized, and an amplitude source signal corresponding to the signal width of the first reversing unit 10 can be obtained as shown in FIG. 2(e).

Thus, the signal propagation delay time in the first reversing unit 10 has a length approximate to that of one cycle time of the output frequency, and in cases in which the length exceeds (is greater than) one cycle time, or in cases in which the length (size) of the minimum pulse width (signal width) that can be outputted in the first reversing unit 10 is approximate to the length of one cycle time of the output frequency, it is difficult to control the output on the basis of the signal width within the same cycle of the basic drive square wave. Therefore, the first reversing unit 10, which is the square wave signal generator in the present invention, is preferably a unit that can output a square wave signal having a signal width of at least half or less of one cycle time during a signal propagation delay time of at least two logic gates or fewer in one cycle time of the output frequency.

In the present embodiment, the AND gate circuit 14 is used to achieve extraction from the basic drive square wave, whereby an excessive time constant (reversed duty ratio) as shown by the dashed lines in FIG. 2 can be prevented. This is preferable because the signal width can be reversed, whereby damage the machinery and other problems can be prevented by reversing the control force. However, the present invention is not limited to this option alone, and the output signal from the first reversing unit 10 may also be inputted unchanged as an amplification source signal to the E-class amplifier 6 without using the AND gate circuit 14, in which case the delay circuit unit 13 can be omitted.

EXAMPLE

FIG. 3 is a circuit diagram showing a circuit that has actually been manufactured. As described above, a NAND gate circuit $IC_2$ is used as the first reversing unit 10, and a capacitor $C_1$ and a drain-to-source resistance ($R_{DS}$) of a field-effect transistor (FET) $Q_1$ are used as the time constant circuit unit 12.

In FIG. 3, a reversing circuit $IC_1$ is a circuit for reshaping the inputted basic drive square wave. This circuit may be omitted in cases in which the basic drive square wave is not adversely affected in the propagation channel of the inputted basic drive square wave.

In the present example, the differentiation circuit unit 9 is configured from $R_1$, $R_2$, and $C_2$; and the $R_1$ side is connected to Vd, whereby "1" as a HIGH state is inputted to the input 2 of the NAND gate circuit $IC_2$ when no front-edge differential signals are being outputted, and "0" as a LOW state is inputted to the input 2 when front-edge differential signal are being outputted. Since the circuit element causes an operation delay, the front-edge differential signal requires a time constant sufficient to maintain the LOW state of "0" until the input 1 of the NAND gate circuit $IC_2$ becomes the LOW state of "0."

In FIG. 3, $IC_5$ through $IC_7$ are delay units; the delay circuit unit 13 is formed by $IC_5$ through $IC_7$; $IC_3$ corresponds to the second reversing unit 11; and $IC_4$ corresponds to the AND gate circuit 14.

In the present embodiment, using the field-effect transistor (FET) $Q_1$ allows the electric potential of the input 1 of the NAND gate circuit $IC_2$ to reach the LOW state of "0" during a time period equal to the time constant composed of $C_1$ and the drain-to-source resistance ($R_{DS}$) corresponding to the gate voltage when the front-edge differential signal is added to the input 1 of the NAND gate circuit $IC_2$ in a state in which the voltage signal is applied as a control signal to the gate of the FET $Q_1$. After the time period equal to the time constant has passed, the electric potential of the input 1 of the NAND gate circuit $IC_2$ reaches the HIGH state of "1," whereby the input state and time period of the input 1 of the NAND gate circuit $IC_2$ can be controlled by the voltage signal of the control signal, making it possible to achieve continuous control that remains stable over time.

In the present embodiment, the NAND gate circuit $IC_2$ is used as the first reversing unit 10, thereby yielding a reversing unit that can produce a pulse width sufficiently short to be used at 13.56 MHz. To describe the operation of this NAND gate circuit $IC_2$, the HIGH state of "1" is inputted, at the time of no output for front-edge differential signals, to the input 2 connected to the differentiation circuit unit 9 configured from the $R_1$, the $R_2$, and the $C_2$ in the manner described above, and the other input 1 is also connected to the Vd via the field-effect transistor (FET) $Q_1$, whereby the HIGH state of "1" is inputted, and the output of the NAND gate circuit $IC_2$ is therefore the low state of "0." When the threshold in the input 2 of the $IC_2$ is $V_{IL}$, the relationship between $R_1$ and $R_2$ is $Vd \cdot R_2/(R_1+R_2) > V_{IL}$.

In this state, when the front-edge differential signal is outputted; i.e., when the LOW state of "0" is inputted to the input 2, the output of the NAND gate circuit $IC_2$ is brought to the HIGH state of "1."

The output of the HIGH state of "1" causes the LOW state of "0," which is the reversed output, to be outputted from the $IC_3$ corresponding to the second reversing unit 11, where by the output of the NAND gate circuit $IC_2$ is maintained at the HIGH state after the start of the input of the LOW state of "0" to the input 1 (immediately following differential signal input), even if the front-edge differential signal is not being outputted; i.e., even if the output is the LOW state of "0."

The electric potential of the input 1 of the $IC_2$ returns back to the HIGH state of "1" after a time period $R_{DS} \cdot C_1$ (sec) corresponding to the gate power of the field-effect transistor (FET) $Q_1$ has passed, whereby the electric potentials of both the input 1 and the input 2 are brought to the HIGH state of "1," and the output of the NAND gate circuit $IC_2$ is therefore brought to the LOW state of "0." Therefore, upon input of the front-edge differential signal, a square wave signal having a signal width within a time period corresponding to a half cycle of the output frequency of 13.56 MHz, which is set in the time constant circuit unit 12, is outputted from the NAND gate circuit $IC_2$, and the first reversing unit 10 formed by the NAND gate circuit $IC_2$ is therefore equivalent to the square wave signal generator in the present invention.

On the basis of a control signal for controlling the power output, the time constant circuit unit 12 of the monostable multivibrator 15 configured from the field-effect transistor (FET) $Q_1$ and other components performs variable control of the pulse width (signal width) outputted from the NAND gate circuit $IC_2$ constituting the first reversing unit 10, which is the square wave signal generator in the present invention. The time constant circuit unit 12 is therefore equivalent to the signal width control circuit in the present invention.

As described above, in cases in which the pulse width (signal width) outputted from the NAND gate circuit $IC_2$ and varied according to the control signal; e.g., in cases in which the pulse width (signal width) in question is half of the pulse width (signal width) of the basic drive square wave, an amplification source signal having a pulse width approximately half (50%) of the pulse width (signal width) of the basic drive square wave is outputted from the AND gate circuit 14 to the E-class amplifier 6 and amplified, and the output is thereby narrowed. Furthermore, in cases in which the pulse width (signal width) outputted from the pertinent NAND gate circuit $IC_2$ is one third of the pulse width (signal width) of the basic drive square wave, an amplification source signal having a pulse width approximately one third (33%) of the pulse width (signal width) of the basic drive square wave is outputted from the AND gate circuit 14 to the E-class amplifier 6 and amplified, and the output is thereby narrowed.

Figure 8:
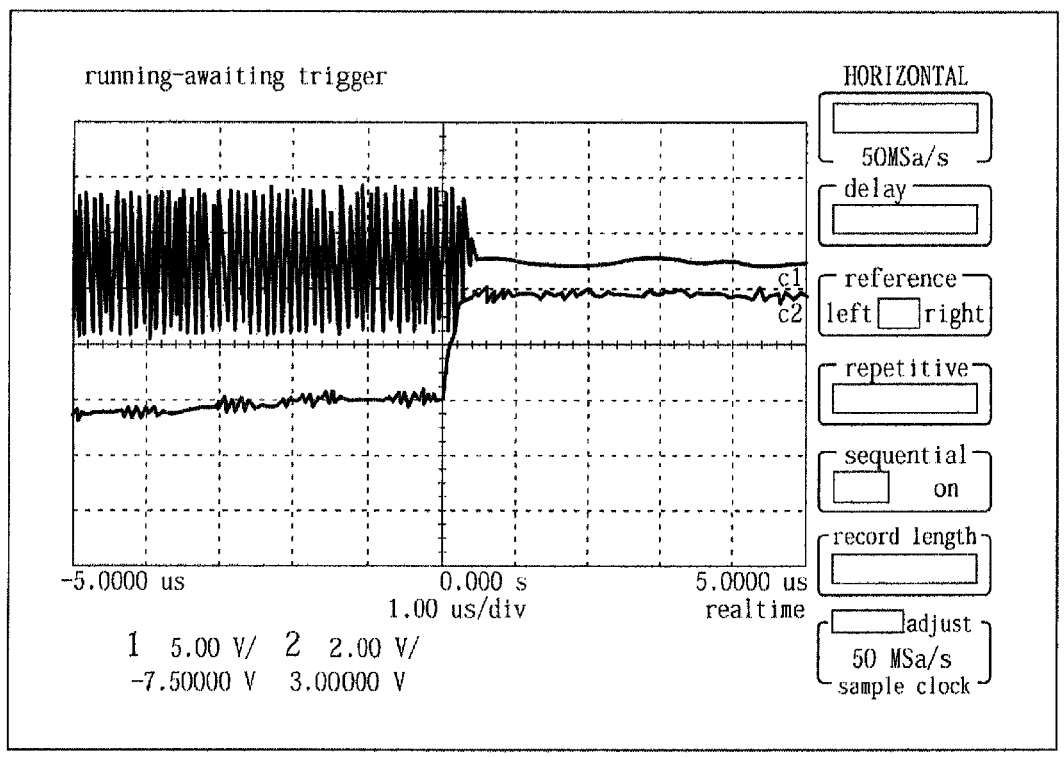
FIG. 8 is a diagram showing the measurement screen of an oscilloscope that has measured the control speed of a high-frequency power supply circuit in an example of the present invention.
Figure 9:
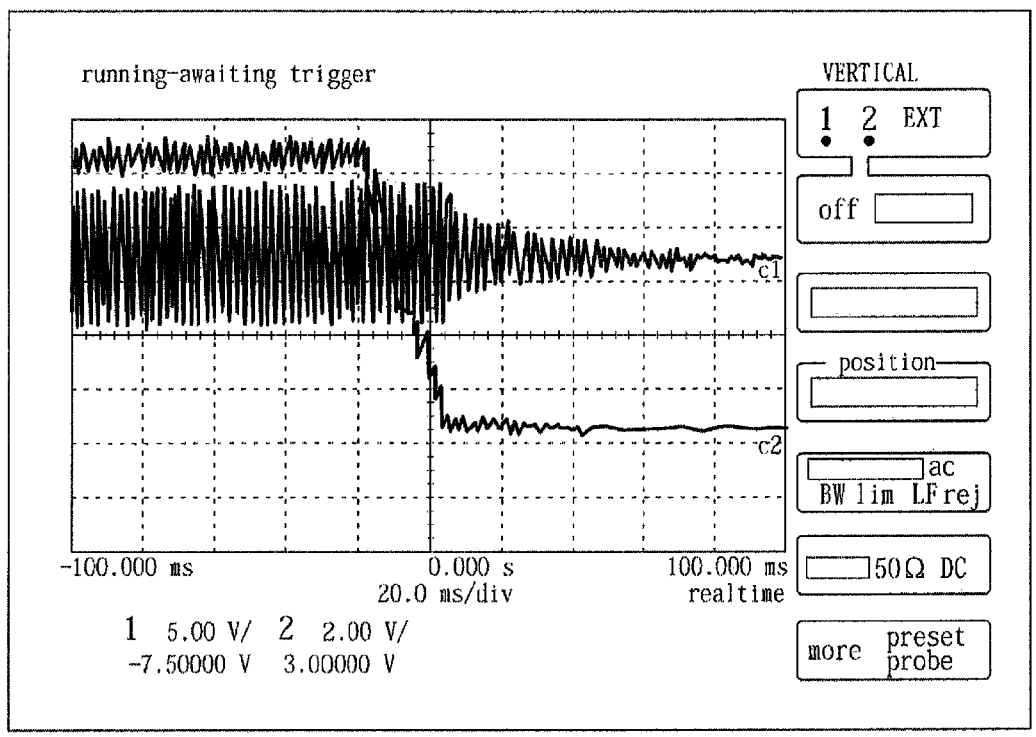
FIG. 9 is a diagram showing the measurement screen of an oscilloscope that has measured the control speed of a conventional power supply circuit.

As described above, according to the high-frequency power supply circuit of the present example, in the monostable multivibrator 15 that serves as a vibrator circuit unit, the input of the front-edge differential signal is used as a trigger for the amplification source signal, a square wave signal is generated that has a signal width shorter than a half cycle of the output frequency and that has an output time period based on the control signal, and the amplification source signal is amplified in the switching amplification circuit unit. Therefore, even at a high output frequency, the signal width of the amplification source signal can be varied according to the control signal by using a simple configuration, and, consequently, the regulation of the output power from the high-frequency power supply circuit amplified by the E-class amplifier 6, which is a switching amplification circuit, can be controlled with high precision over time by using a simple configuration. Specifically, the regulation can be controlled with an accuracy of about 200 nanoseconds, as shown in FIG. 8.

According to the high-frequency power supply circuit of the present example, the signal width control circuit can be provided with a simple configuration that has the second reversing unit and the time constant circuit unit 12. This can be achieved by using the monostable vibrator based on a DC-AC link as the vibrator circuit unit. Therefore, there is a greater degree of freedom in the circuit design, and a vibrator circuit unit having satisfactory precision and a simple configuration can be obtained.

According to the high-frequency power supply circuit of the present example, the first reversing unit 10 is formed using a NAND gate circuit $IC_2$ that can operate at higher speeds than can a common MSI multivibrator, whereby a square wave signal of a shorter signal width can be generated, and the range of controllable output power can be further increased.

According to the high-frequency power supply circuit of the present example, since the signal width can be varied with each cycle of output frequency, the output power within the same cycle can be controlled with maximum precision over time.

According to the high-frequency power supply circuit of the present example, the AND gate circuit 14 is used, whereby the signal width of an amplification source signal can be prevented from reversing, and disturbance can be prevented from being caused by the reversing of the signal width (reversed duty).

According to the high-frequency power supply circuit of the present example, the delay circuit unit 13 is used, whereby it is possible to avoid drawbacks in which the signal width of the amplification source signal extracted by the AND gate circuit 14 as the logic gate circuit becomes shorter in proportion to the signal propagation delay time.

According to the high-frequency power supply circuit of the present example, since a field-effect transistor (FET) is used as the time constant control element, the time constant does not readily fluctuate in large amounts over time, and stable and continuous control can therefore be achieved using the control signal inputted to the time constant circuit unit.

According to the high-frequency power supply circuit of the present example, since the basic drive square wave is generated using a double frequency, a basic drive square wave having a duty ratio of approximately 50% can be generated with a high degree of precision.

Examples of the present invention were described above based on the drawings, but the specific configuration is not limited to these examples, and the present invention includes modifications and additions within a range that does not deviate from the scope of the present invention.

For example, in the examples described above, a reference operation signal was generated having the same frequency (13.56 MHz) as the high-frequency output of the high-frequency power supply circuit, and a double frequency (double wave: 27.12 MHz) of the reference operation signal was generated by the double-frequency generation circuit 2, but the present invention is not limited to this option alone. Another option is to not use this double-frequency generation circuit 2, but to directly generate a double frequency of the reference operation signal by using, e.g., a 27.12-MHz oscillator.

In the examples described above, a double wave was used as the double frequency, but the present invention is not limited to this option alone, and another possibility is to use a more than double wave, such as a quadruple or octuple wave, and to generate a basic drive square wave or a control square wave which is a square wave having a duty ratio of approximately 50%.

In the examples described above, the basic drive square wave was generated using a double frequency, but the present invention is not limited to this option alone, and another possibility is to generate the basic drive square wave without using a double frequency.

In the examples described above, the AND gate circuit 14 was used as a logic gate circuit, but the present invention is not limited to this option alone, and a multi-input logic gate circuit (NAND gate circuit or OR gate circuit) having a suitable and appropriate AND operation circuit function based on the control scheme can be used as the logic gate circuit.

In the examples described above, a low pass filter (LPF) 7 is provided, making it possible to achieve output in the for of both sine waves and pulses, but the present invention is not limited to this option alone, and either one of these outputs alone may be used.

In the examples described above, the delay circuit unit 13 was used, but the present invention is not limited to this option alone, and the delay circuit unit 13 may be omitted in cases in which the output frequency is comparatively low and the delay propagation time period in the first reversing unit 10 is small enough for the signal width of the output frequency.

Figure 4:
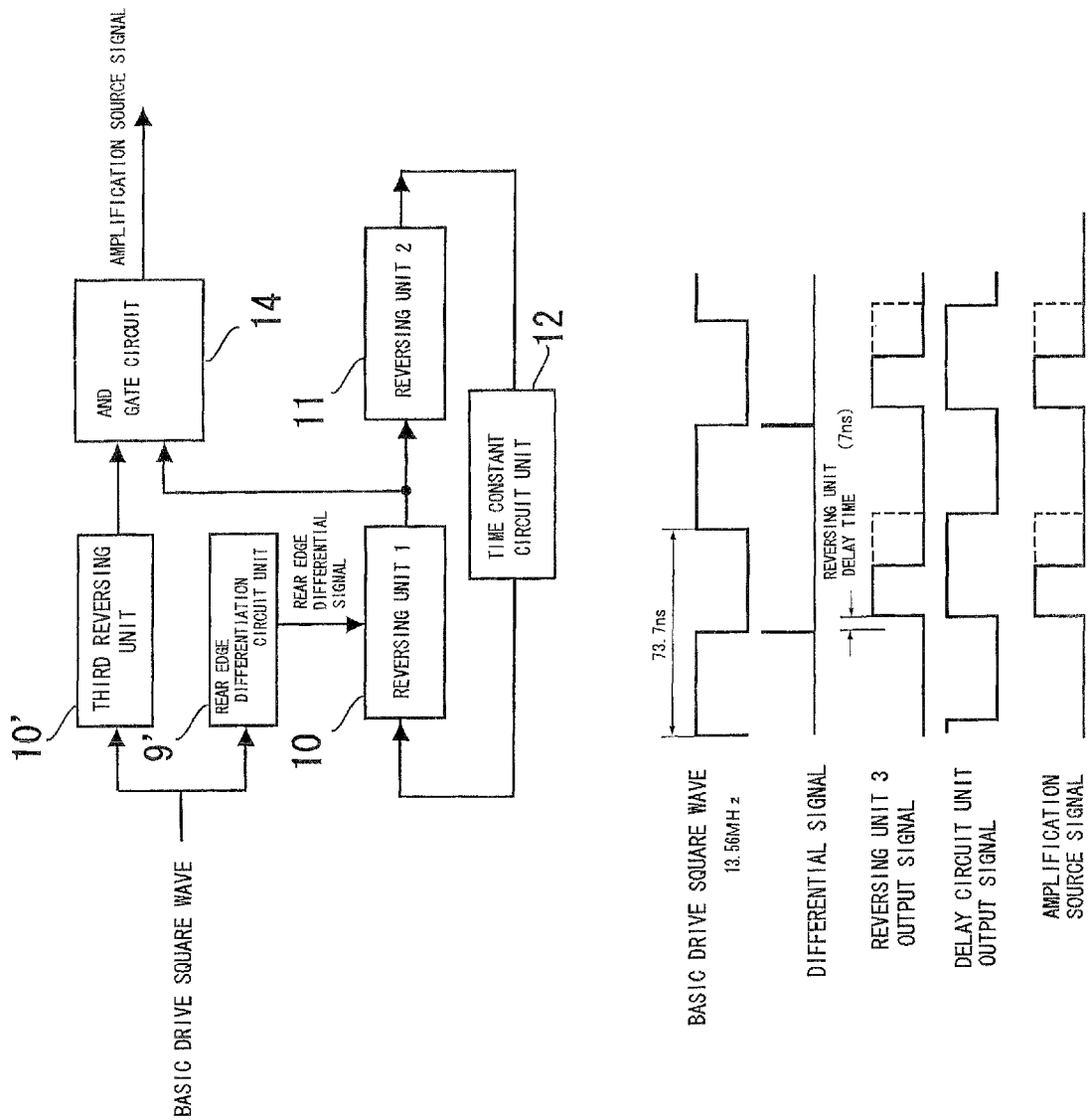
FIG. 4 is a circuit structure diagram showing the high-frequency power supply circuit of another aspect.
Figure 5:
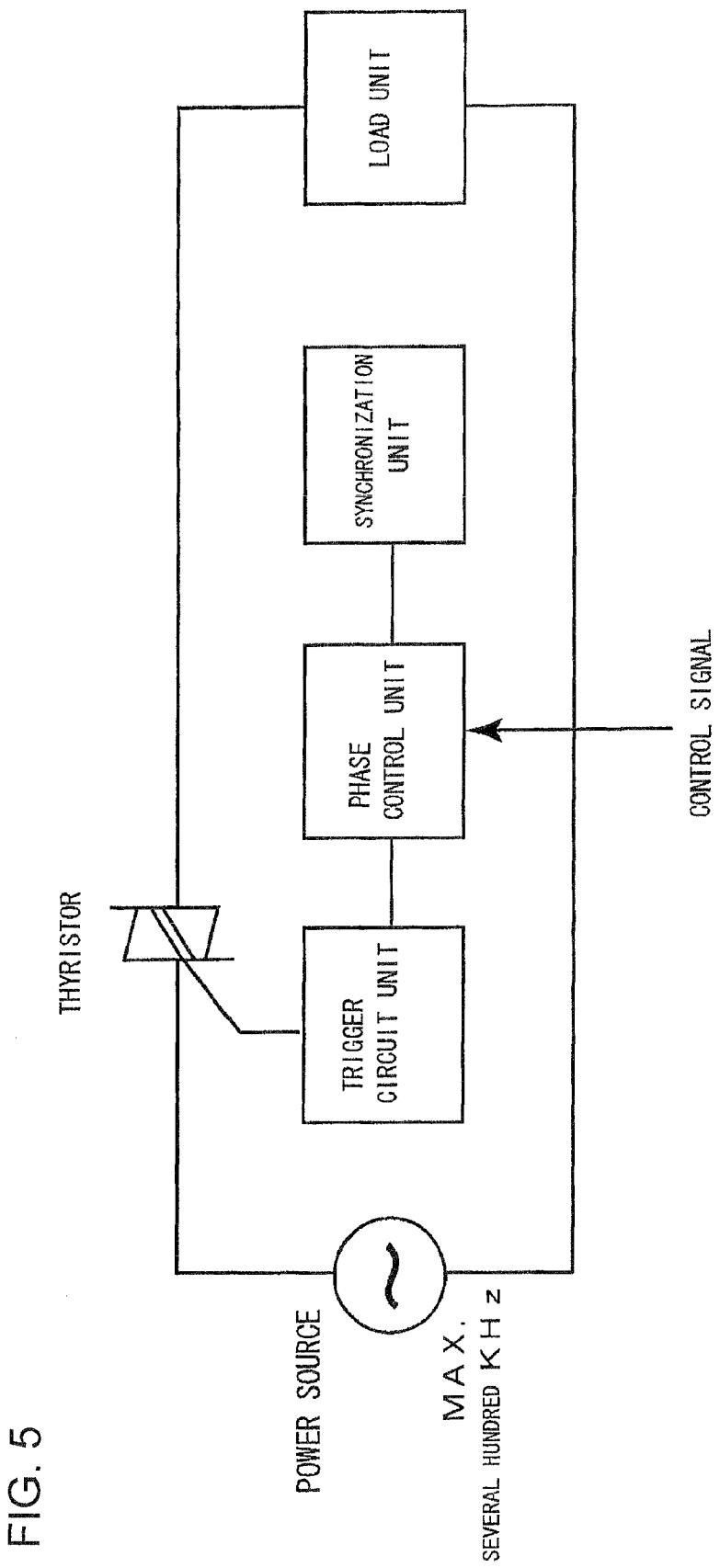
FIG. 5 is a diagram showing the configuration of a conventional power supply circuit.

In the examples described above, a differential signal is used and a front-edge differential signal is inputted as a trigger signal to the first reversing unit 10, but the present invention is not limited to this option alone. For example, a rear-edge differentiation circuit unit 9' may be used to input a rear-edge differential signal to the first reversing unit 10, and a third reversing unit 10', which is the same reversing unit as the first reversing unit 10, may be used as the delay circuit unit 13, as shown in FIG. 4, thereby obviating the need to match the two delay propagation time periods inputted to the AND gate circuit 14.

In the examples described above, the time constant circuit unit 12 based on the field-effect transistor (FET) $Q_1$ was given as an example of a time constant control element, but the present invention is not limited to this option alone, and a CdS photocell, a variable-capacitance diode, or the like can be used as the time constant control element.

Figure 6:
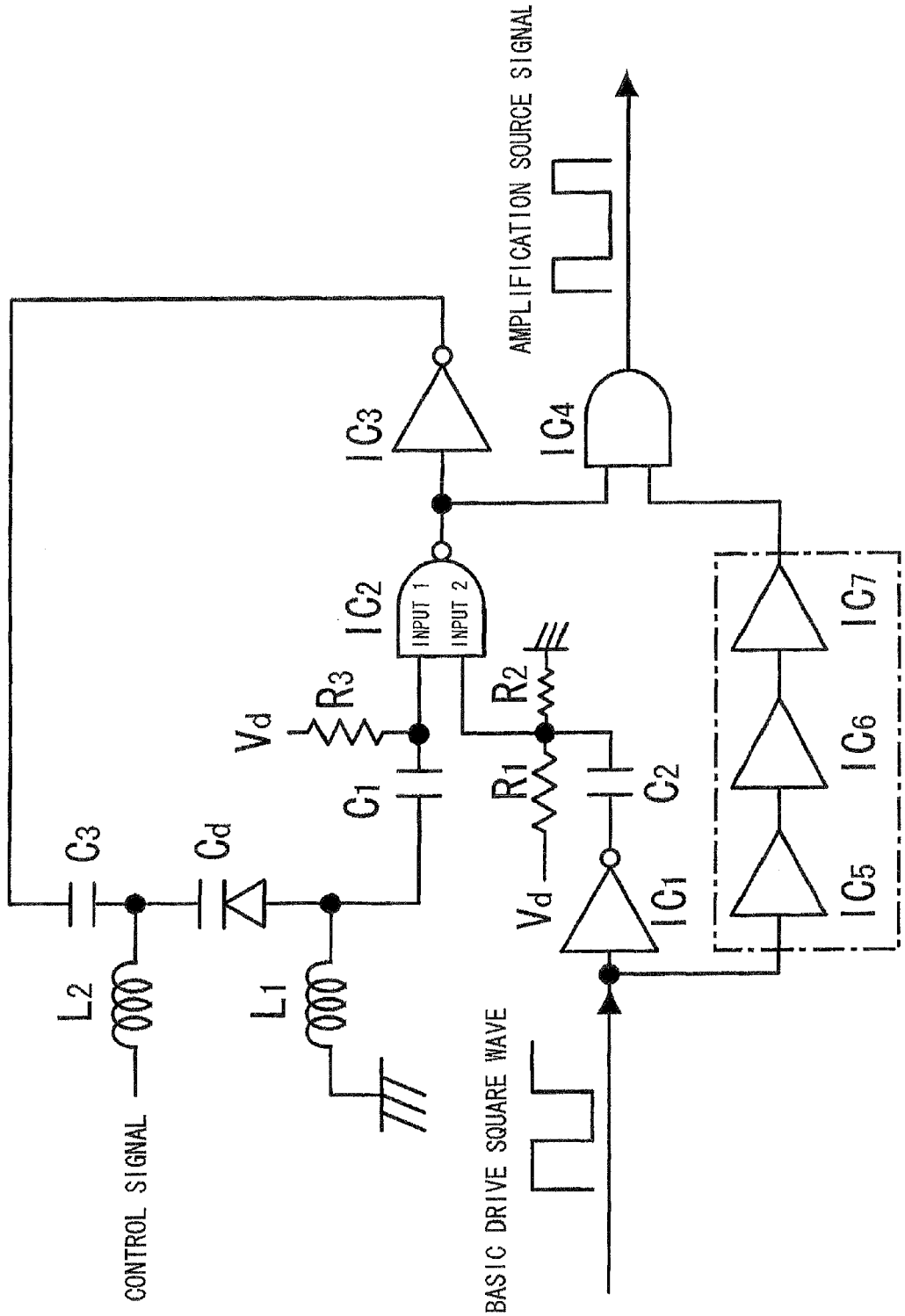
FIG. 6 is a drawing showing the configuration of a high-frequency power supply circuit of another aspect.
Figure 7:
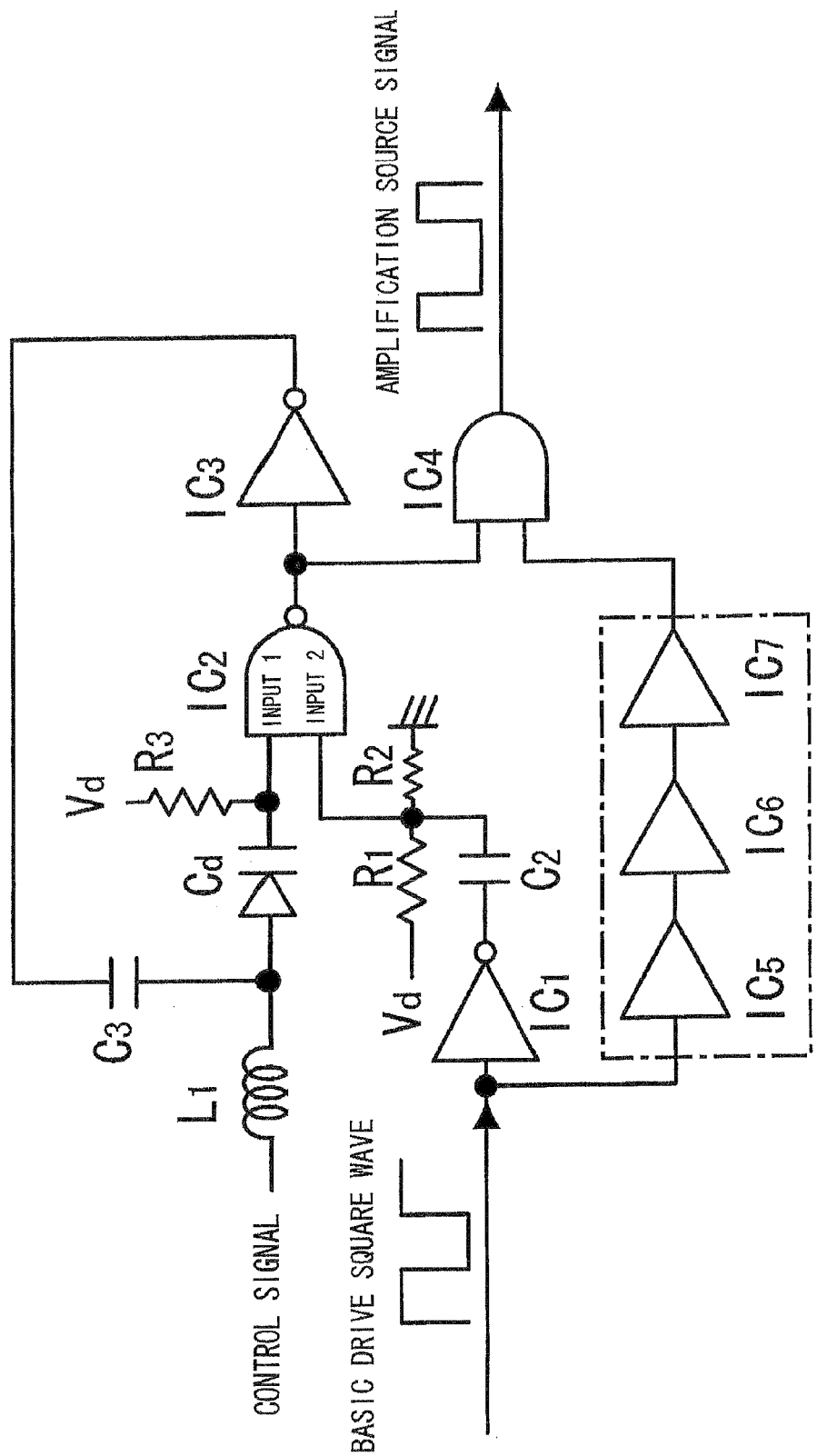
FIG. 7 is a drawing showing the configuration of a high-frequency power supply circuit of another aspect.

Specifically, in cases in which a variable-capacitance diode is used, the operation as such is the same as that of the circuit in FIG. 3 except for the use of electrostatic capacitance to vary the time constant as shown in FIG. 6. Cd in the circuit in FIG. 6 is the electrostatic capacitance of the variable-capacitance diode. As is conventionally known, C1 and C3 are direct current blockers, and are commonly set so that $C_1$ and $C_3$ are much greater than Cd. The time constant is determined by R and Cd. FIG. 6 is an example of using the most common variable-capacitance diode, and FIG. 7 shows, as an example of application, and example in which a variable-capacitance diode specifically adapted for the present invention is used.

In the examples described above, 13.56 MHz, which is a frequency that cannot be controlled with a thyristor or the like, was used as an example of the output frequency, but the present invention is not limited to this option alone, and it is apparent that the high-frequency power supply circuit of the present invention can be used with an output frequency of several hundred kilohertz that can be used by a thyristor.

In the examples described above, a monostable multivibrator circuit having AC-DC links was used as the vibrator circuit unit, but the present invention is not limited to this option alone. Another possibility is to use a vibrator circuit unit that can output a square wave signal having a signal width within a time period equivalent to a half cycle of the required output frequency upon the input of a trigger signal from an external source, and that can variably control the signal width of the square wave signal on the basis of a control signal.

The invention claimed is:

1. A high-frequency power supply circuit characterized in comprising:
    a basic drive square wave generation circuit unit for generating a basic drive square wave having an output frequency outputted from the high-frequency power supply circuit;
    a differentiation signal generation circuit unit for generating a front edge or rear edge differential signal of the generated basic drive square wave;
    a vibrator circuit unit having square wave signal generator for outputting a square wave signal having a signal width within a time period corresponding to a half cycle of the output frequency upon input of a trigger signal from an external source, and signal width control circuits for variably controlling the signal width of said square wave signal on the basis of a control signal for controlling power output frequency; and
    a switching amplification circuit unit for amplifying an amplification source signal based on an output signal from the vibrator circuit unit;
    the differential signal being generated by the differential signal generation circuit unit is used as a trigger signal in said vibrator circuit unit.

2. The high-frequency power supply circuit according to claim 1, characterized in that:
    said square wave signal generator comprises a first reversing unit for initiating reverse output of an input signal upon the input of said differential signal; and
    said signal width control circuit has a second reversing unit for reversing the output signal from the first reversing unit and inputting the reversed signal to the first reversing unit, and a time constant circuit unit whereby the output signal outputted from the second reversing unit is blocked from being inputted to the first reversing unit within a time period determined by a time constant that varies according to said control signal.

3. The high-frequency power supply circuit according to claim 2, characterized in that said first reversing unit is formed from a multi-input transformation logic gate circuit.

4. The high-frequency power supply circuit according to claim 1, characterized in that the square wave signal generator outputs a square wave signal having a signal width of at least half or less of one cycle time during the signal propagation delay times of at least two logic gates or fewer in one cycle time of the output frequency.

5. The high-frequency power supply circuit according to claim 1, characterized in compromising:
    a logic gate circuit for receiving input of said basic drive square wave and an output signal from said vibrator circuit unit, and extracting the inputted basic drive square wave according to the inputted output signal from the vibrator circuit unit; wherein
    said switching amplification circuit unit amplifies the output signal from said logic gate circuit as said amplification source signal.

6. The high-frequency power supply circuit according to claim 5, characterized in comprising a delay circuit for delaying the basic drive square wave inputted to said logic gate circuit within the signal propagation delay time period in said vibrator circuit unit.

7. The high-frequency power supply circuit according to claim 1, characterized in that aid time constant circuit unit has, as a time constant control element, a field-effect transistor (FET), a Cds element, a variable-capacitance diode, or a combination thereof.

8. The high-frequency power supply circuit according to claim 1, characterized in that:
    said basic drive square wave generation circuit has a double-frequency generation circuit for generating a double frequency of said basic drive square wave; and
    the double frequency generated by the double-frequency generation circuit is used to generate a basic drive square wave having a duty ratio of approximately 50%.

* * * * *

UNITED STATES PATENT AND TRADEMARK OFFICE
CERTIFICATE OF CORRECTION

PATENT NO.        : 7,808,224 B2                                                      Page 1 of 1
APPLICATION NO.   : 12/097861
DATED             : October 5, 2010
INVENTOR(S)       : Honda It is certified that error appears in the above-identified patent and that said Letters Patent is hereby corrected as shown below:

Title Page;

(22) PCT Filed: August 11, 2006 should be -- (22) PCT Filed: November 8, 2006 --

Signed and Sealed this
First Day of March, 2011

David J. Kappos
*Director of the United States Patent and Trademark Office*